United States Patent
Furuya et al.

(10) Patent No.: US 9,922,861 B2
(45) Date of Patent: Mar. 20, 2018

(54) SUBSTRATE GRIPPING DEVICE AND SUBSTRATE PROCESSING APPARATUS

(71) Applicant: SHIBAURA MECHATRONICS CORPORATION, Yokohama-shi, Kanagawa (JP)

(72) Inventors: Masaaki Furuya, Yokohama (JP); Koichi Higuchi, Yokohama (JP)

(73) Assignee: SHIBAURA MECHATRONICS CORPORATION, Yokohama-Shi, Kanagawa (JP)

( * ) Notice: Subject to any disclaimer, the term of this patent is extended or adjusted under 35 U.S.C. 154(b) by 130 days.

(21) Appl. No.: 14/247,329

(22) Filed: Apr. 8, 2014

(65) Prior Publication Data
US 2014/0299166 A1    Oct. 9, 2014

(30) Foreign Application Priority Data

Apr. 9, 2013   (JP) ................................. 2013-081074

(51) Int. Cl.
*H01L 21/687* (2006.01)
(52) U.S. Cl.
CPC .............................. *H01L 21/68728* (2013.01)
(58) Field of Classification Search
None
See application file for complete search history.

(56) References Cited

U.S. PATENT DOCUMENTS

| 5,322,079 | A  | * | 6/1994 | Fukutomi | B08B 11/02 |
| | | | | | 134/153 |
| 6,435,200 | B1 | * | 8/2002 | Langen | H01L 21/67051 |
| | | | | | 118/52 |
| 6,827,092 | B1 | * | 12/2004 | Smith | H01L 21/68728 |
| | | | | | 134/147 |

(Continued)

FOREIGN PATENT DOCUMENTS

| JP | 06-037003 A | | 2/1994 |
| JP | 06037003 A | * | 2/1994 |

(Continued)

OTHER PUBLICATIONS

Taiwan Office Action with English translation, Taiwanese Patent Application No. 103112829, dated Jun. 2, 2017, 12 pgs.

(Continued)

*Primary Examiner* — Jason Ko
*Assistant Examiner* — Cristi Tate-Sims
(74) *Attorney, Agent, or Firm* — Volpe and Koenig, P.C.

(57) ABSTRACT

A rotary table; a drive motor M configured to rotate the rotary table; a pin base supported by the rotary table; a pin fixing member configured to move closer to or away from C1 upon the pin base revolving; first chuck pins and second chuck pins provided on the pin fixing member and configured to be into contact with an outer edge of the substrate W; a substrate gripping force generation mechanism including a spring member; a chuck pin switching mechanism including an inertia member configured to be rotated coaxially with the rotary table and a protruded member provided on an (Continued)

outer peripheral part of the inertia member; and a cam member provided on the pin fixing member and configured to engage with protruded member.

8 Claims, 11 Drawing Sheets

(56) References Cited

U.S. PATENT DOCUMENTS

| | | | |
|---|---|---|---|
| 2004/0159343 A1* | 8/2004 | Shimbara | G11B 23/505 134/33 |
| 2006/0027323 A1* | 2/2006 | Miya | H01L 21/68728 156/345.23 |
| 2008/0110861 A1 | 5/2008 | Kajita et al. | |

FOREIGN PATENT DOCUMENTS

| | | | |
|---|---|---|---|
| JP | 09-107023 | A | 4/1997 |
| JP | 09107023 | A * | 4/1997 |
| JP | 2004-111902 | A | 4/2004 |
| JP | 2005-244196 | A | 9/2005 |
| JP | 3762275 | B2 | 4/2006 |
| JP | 2006-312225 | A | 11/2006 |
| JP | 2007-103730 | A | 4/2007 |
| JP | 2007-523463 | A | 8/2007 |
| JP | 3955176 | B2 | 8/2007 |
| JP | 4681148 | B2 | 5/2011 |

OTHER PUBLICATIONS

JP First Office Action, JP Patent Application No. 2013-081074, dated Feb. 21, 2017, 3 pages.

* cited by examiner

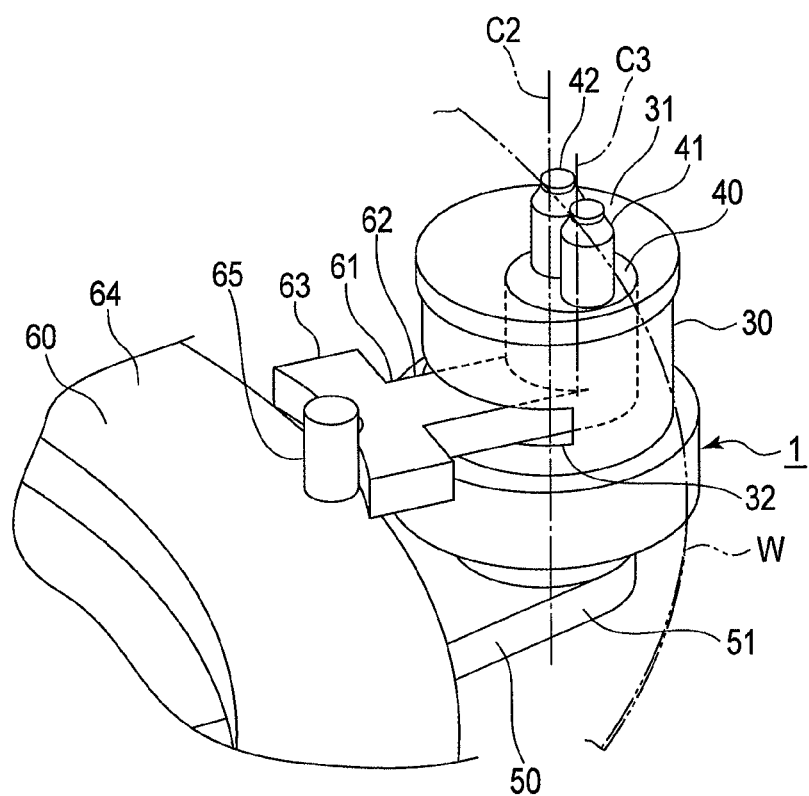
F I G. 2

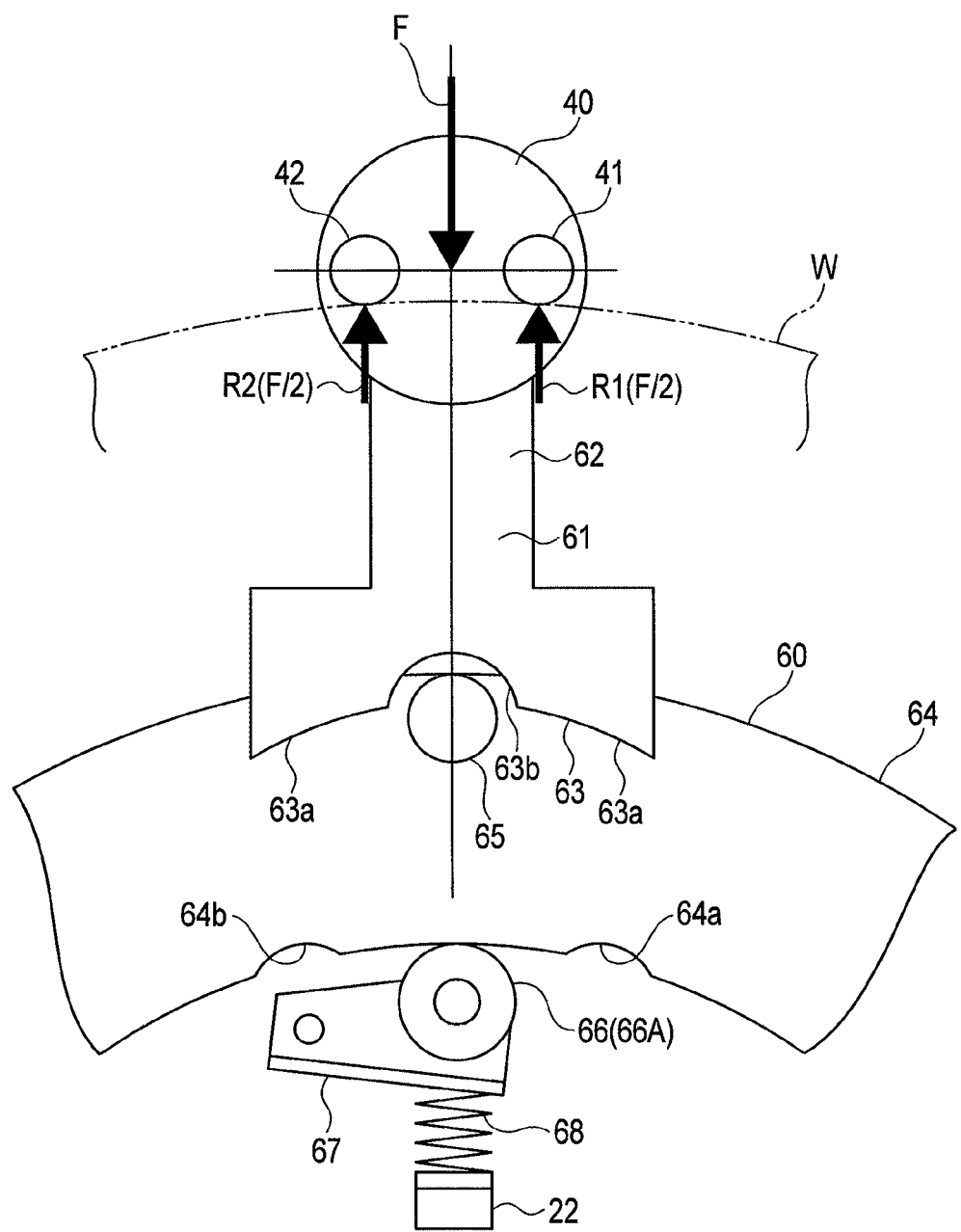
F I G. 12

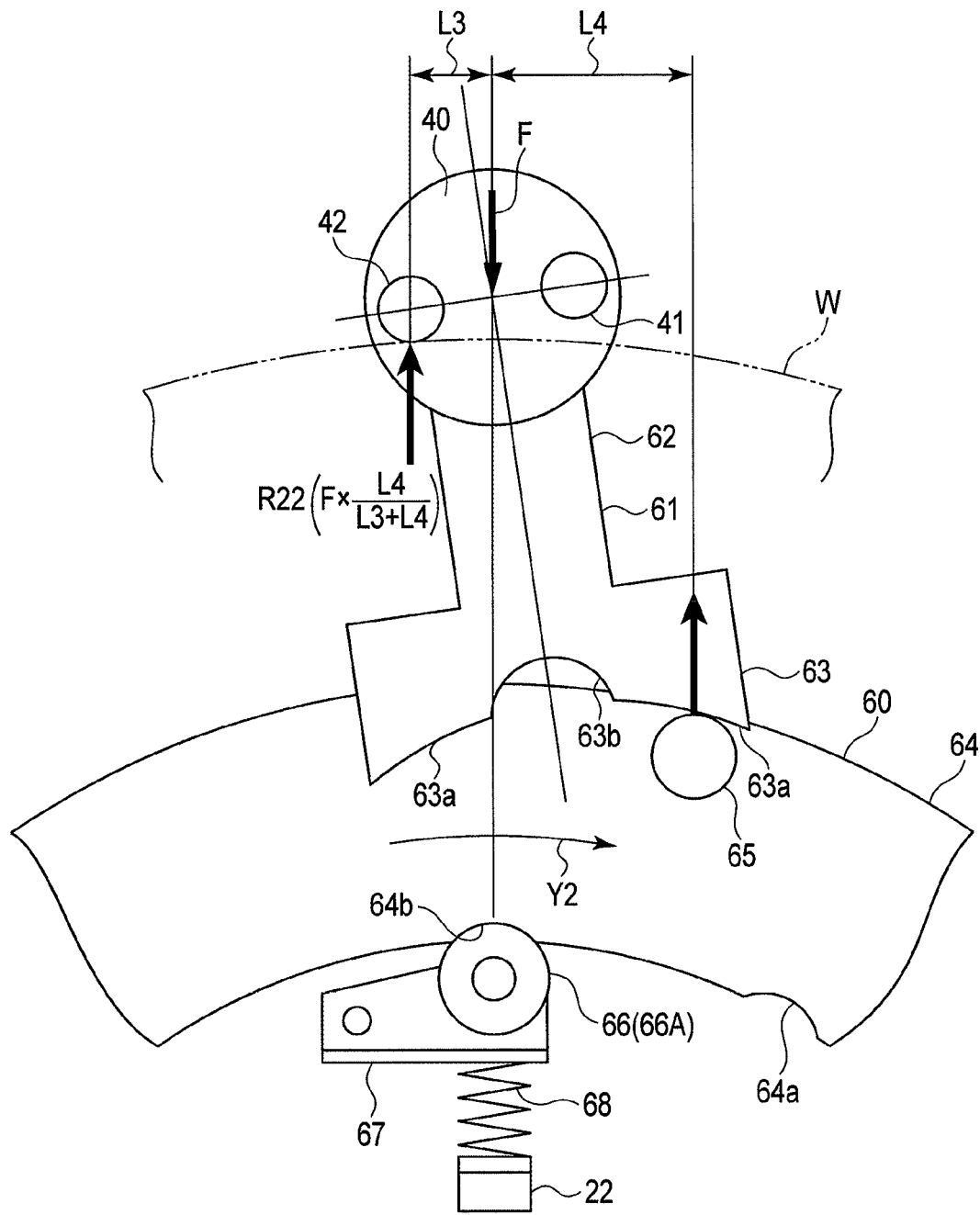
F I G. 13

SUBSTRATE GRIPPING DEVICE AND SUBSTRATE PROCESSING APPARATUS

CROSS REFERENCE TO RELATED APPLICATIONS

This application is based upon and claims the benefit of priority from the prior Japanese Patent Applications No. 2013-081074, filed Apr. 9, 2013, the entire contents of which are incorporated herein by reference.

FIELD OF INVENTION

The present invention relates to a substrate gripping device and substrate processing apparatus that are suitable for use in performing a process, such as cleaning or etching, while rotating a semiconductor substrate or the like.

BACKGROUND

For example, as techniques for forming circuit patterns on a circular disk-shaped substrate in the course of manufacturing semiconductor devices, there is known a film formation process sequence and a photolithography process sequence. According to these process sequences, a film formation process and a cleaning process are repeatedly performed on the substrate.

In cleaning and drying processes of this kind, a substrate gripping device is used (for example, see Japanese Patent No. 4681148). This substrate gripping device includes a rotary table provided therein for driving rotation. The rotary table is equipped with a plurality of pin bases on its outer peripheral part such that each of them is revolvable about an axis parallel with the rotational axis of the rotary table.

A chuck pin is protruded at an eccentric position on the upper surface of each of the pin bases. This chuck pin has a receiving surface slanted downward toward the center of the rotary table.

These pin bases are configured to be rotationally driven in the same direction by a driving means. Accordingly, when the pin bases are rotated in a predetermined direction to eccentrically rotate the chuck pins, the receiving surfaces of the chuck pins are brought into contact with the bottom side of the substrate at its outer edge portions, so that the rotary table integrally grips a substrate.

When a substrate is processed, the rotary table is rotated along with the substrate gripped thereon, while a process liquid is sprayed onto the process target surface of the substrate. The process liquid flows in the radial direction of the substrate by the rotation of the rotary table, and the process target surface of the substrate is thereby processed. However, the process liquid cannot flow at the positions where the chuck pins are in contact, and so unprocessed portions are generated on the substrate. As a countermeasure for this problem, there is known a method that rotates the chuck pins to change the gripping positions, or a method that provides two chuck pins on each of the pin bases and switches these chuck pins when gripping the substrate (for example, see Japanese Patent No. 3955176 and Japanese Patent No. 3762275). In the case of the method that uses the two chuck pins for re-gripping, the switching is performed while the substrate is supported by substrate support pins from the bottom side of the substrate. Other than these methods, there is known a method that causes the substrate to slide on the receiving surfaces of the chuck pins by use of acceleration and deceleration of the rotary table.

After the predetermined process is performed on the substrate, the pin bases are rotated in the direction opposite to the predetermined direction mentioned above to cancel the gripping state of the substrate, so that the substrate can be taken out of the rotary table.

However, the substrate gripping device described above has the following problems. Specifically, in the case of the method that rotates the chuck pins to change the gripping positions, the substrate may slide if the gripping force is not larger than a certain level, and so it is difficult to judge whether the position change has been certainly performed. Further, this method needs to incorporate a mechanism for rotating the chuck pins while rotating the substrate, and the structure of the device thereby becomes complicated as a whole.

In the case of the method that uses the two chuck pins for re-gripping, the substrate support pins are brought into contact with the bottom side of the substrate. However, when the substrate reverse side is processed, this substrate reverse side needs the pins to be out of contact therewith, and so this method is not applicable to the reverse side process. In addition, the rotary table needs to once stop rotation when performing the chuck pin switching, and the process time is thereby prolonged. Further, other than the rotational drive mechanism of the rotary table, a switching mechanism for the two chuck pins is required, and the structure is thereby complicated.

In the case of the method that causes the substrate to slide on the receiving surfaces of the chuck pins, it is necessary to apply an inertia force not smaller than the friction force between the substrate and the receiving surfaces of the chuck pins. However, this friction force varies depending on the end portion shape and/or surface state of the substrate and the process steps, and so it is difficult to stably perform the operation.

SUMMARY

An object of the present invention is to provide a substrate gripping device and substrate processing apparatus that can reliably perform the switching of chuck pins for gripping the substrate while rotating the substrate.

In order to solve the problem described above so as to achieve the object, the substrate gripping device and substrate processing apparatus according to the present invention are constituted as follows.

A substrate gripping device for rotating a substrate while gripping outer edge portions of the substrate, the substrate gripping device comprising: a rotary table configured to be rotated; a drive portion configured to rotate the rotary table; first and second chuck pins provided on the rotary table and configured to be into contact with an outer edge of the substrate; an inertia member disposed coaxially with the rotary table and configured to be rotated relative to the rotary table; and a chuck pin switching mechanism configured to change chucking states of the first and second chuck pins relative to the substrate by utilizing a relative movement between the rotary table and the inertia member upon a change in rotational speed of the rotary table.

A substrate processing apparatus configured to rotate a substrate while gripping the substrate by a substrate gripping device and to supply a process liquid from a nozzle onto the substrate to process the substrate by use of the process liquid, the substrate processing apparatus comprising: the substrate gripping device is the substrate gripping device according to this invention described above.

A substrate processing apparatus comprising: a substrate gripping device configured to rotate a substrate while gripping the substrate; and a nozzle configured to supply a process liquid onto the substrate to process the substrate by use of the process liquid, wherein the substrate gripping device is the substrate gripping device according to this invention described above.

According to the present invention, it is possible to reliably perform the switching of chuck pins for gripping the substrate while rotating the substrate.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 2 is a perspective view showing a main part of the substrate gripping device;

FIG. 12 is an explanatory view showing a gripping force generated in the main part of the chuck pin switching mechanism when the chuck pin switching mechanism is in the second state;

FIG. 13 is an explanatory view showing a force and a moment generated in the main part of the chuck pin switching mechanism when the chuck pin switching mechanism is in the third state.

DETAILED DESCRIPTION OF THE PREFERRED EMBODIMENTS

Figure 1:
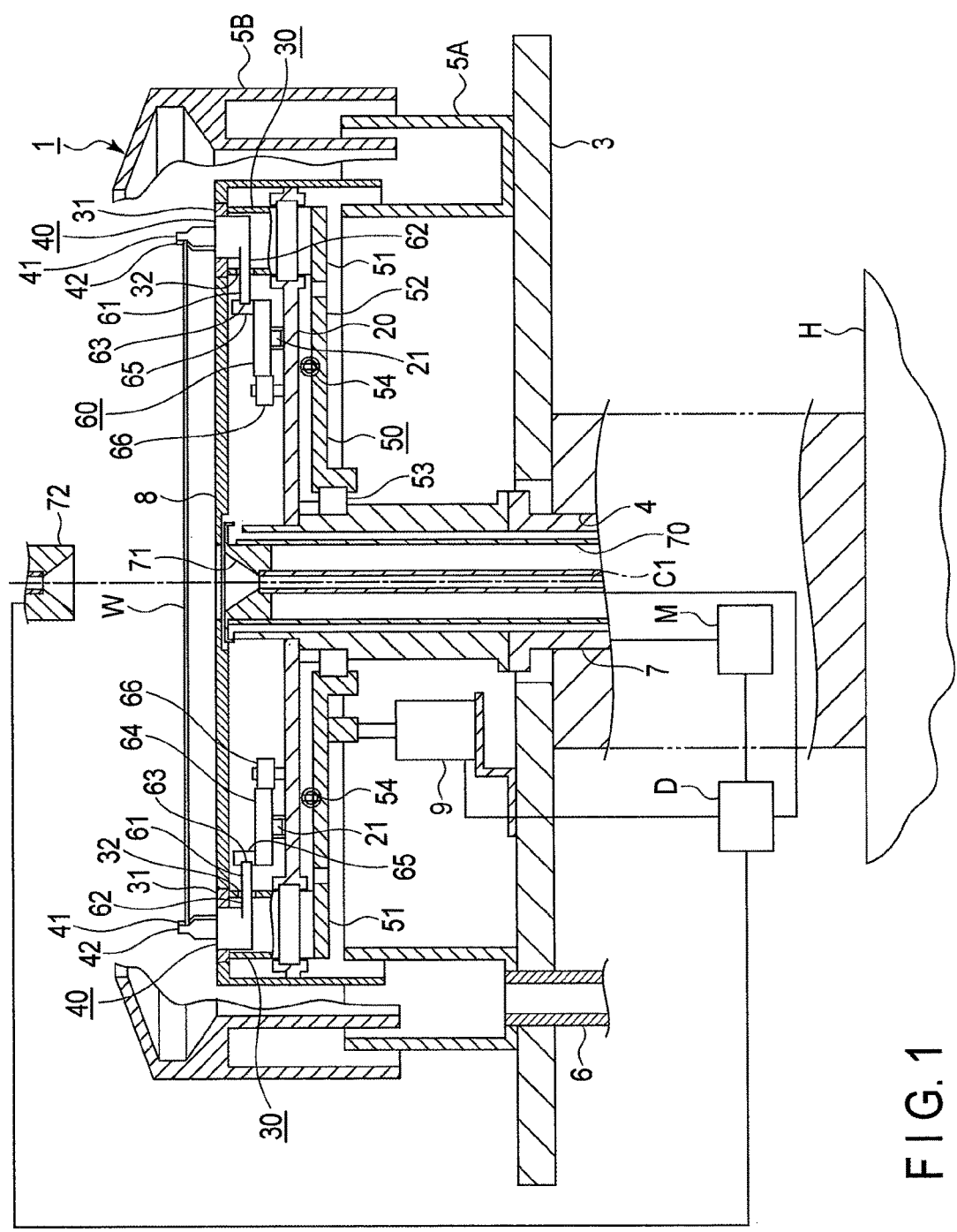
FIG. 1 is a sectional side view showing a substrate gripping device according to an embodiment of the present invention.
Figure 3:
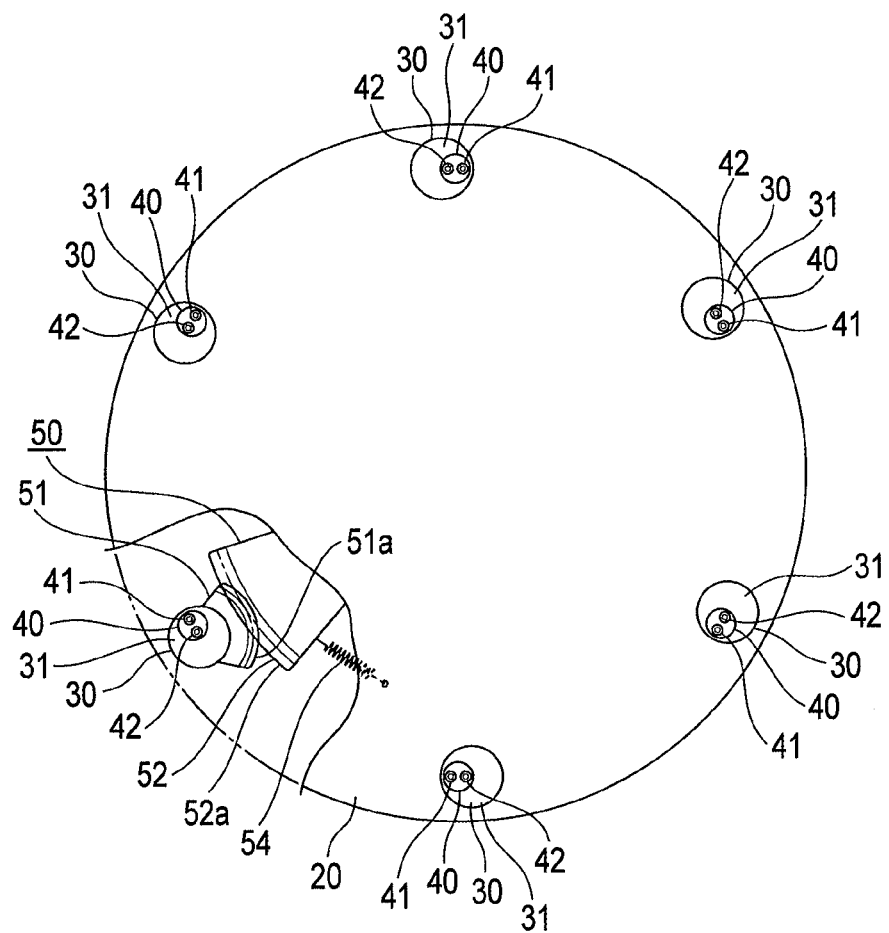
FIG. 3 is a partially cut plan view showing a rotary table and a gripping force generation mechanism provided in the substrate gripping device.
Figure 4:
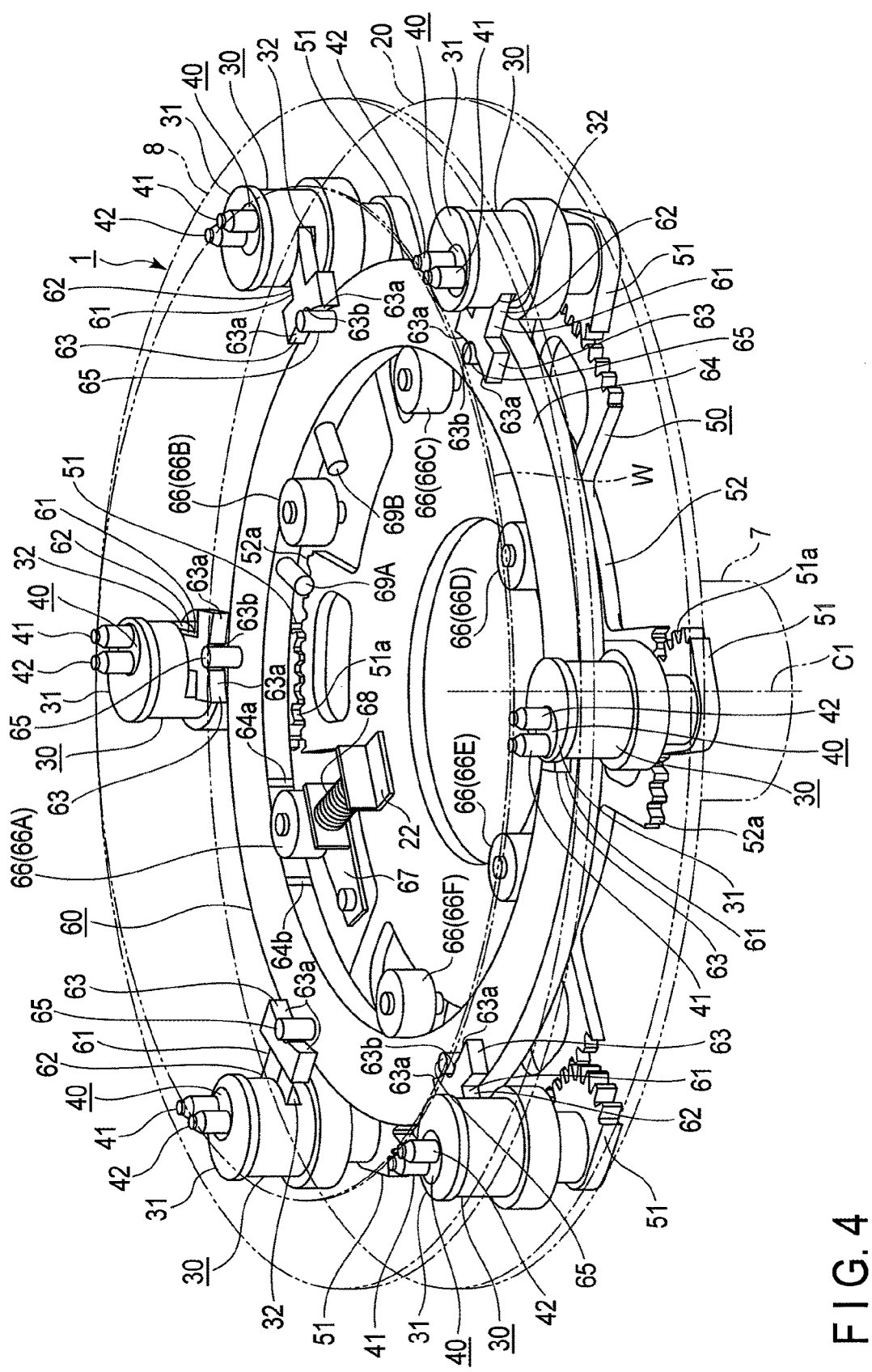
FIG. 4 is a perspective view showing a chuck pin switching mechanism provided in the substrate gripping device.

FIG. 1 is a sectional side view showing a substrate gripping device 1 according to an embodiment of the present invention. FIG. 2 is a perspective view showing a main part of the substrate gripping device 1. FIG. 3 is a partially cut plan view showing a rotary table 20 and a gripping force generation mechanism 50 provided in the substrate gripping device 1. FIG. 4 is a perspective view showing a chuck pin switching mechanism 60 provided in the substrate gripping device 1.

It should be noted in the following explanation that a first state is a state of gripping a substrate W only by first chuck pins 41 by use of an inertia force by an inertia member 64 described later; a second state is a state of gripping the substrate W by both of the first chuck pins 41 and the second chuck pins 42; and a third state is a state of gripping the substrate W only by the second chuck pins 42 by use of an inertia force by the inertia member 64.

The substrate gripping device 1 has functions to rotate a circular disk-shaped substrate W while gripping outer edge portions of the substrate W, when a process is performed while a process liquid is sprayed from an upper nozzle head 72 and a lower nozzle head 71, described later, onto the substrate W being rotated.

As shown in FIG. 1, the substrate gripping device 1 includes a rotary table 20 fixed to a power transmission body 7, described later; pin bases 30 supported on the outer peripheral part of the rotary table 20; a pin fixing member 40 supported by each of the pin bases 30; a gripping force generation mechanism 50 configured to revolve the pin bases 30; a chuck pin switching mechanism 60 configured to perform the switching between the first state, the second state, and the third state, described later; and a holding cylinder 70 configured to spout a process liquid onto the substrate W.

A circular plate base portion 3 is fixed to the floor surface H and includes a through hole 4 opened to its upper surface at the radial direction center. A liquid receiver 5A and a movable liquid receiver (cup body) 5B are disposed along the annular direction on the radial direction outer peripheral part of the base portion 3. The liquid receiver 5A is connected to a discharge pipe 6 at the bottom. The movable liquid receiver 5B is located above the liquid receiver 5A. The upper end portion of the movable liquid receiver 5B is slanted inward in the radial direction of the substrate gripping device 1. Further, a canceling mechanism 9, described later, is provided on the upper surface side of the base portion 3.

The cylindrical power transmission body 7 is disposed in the through hole 4 such that it is extended upward from the upper surface of the base portion 3. The power transmission body 7 has a rotational axis C1 and is configured to be rotationally driven by a control motor (drive portion) M serving as a drive source. Further, a circular disk-shaped cover 8 is attached to the periphery of the distal end portion of the power transmission body 7.

The circular disk-shaped rotary table 20 is set coaxially with the power transmission body 7 and is fixed to the periphery of the distal end portion of the power transmission body 7 protruded upward from the through hole 4 and above the upper surface of the base portion 3, wherein the rotary table 20 is located at a position that is closer to the base portion 3 than the position of the cover 8. Thus, the rotary table 20 is configured to be rotated about the rotational axis C1 by the power transmission body 7.

A plurality of support bearings 21 are provided on the upper surface of the rotary table 20 such that each of them defines its own rotational axis in the radial direction of the rotary table 20. The support bearings 21 are disposed at positions separated at predetermined intervals in the annular direction of the rotary table 20 and they support the inertia member 64 (described later) from below. Further, as shown in FIG. 4, a fixing support platform 22 is provided on the upper surface of the rotary table 20. The fixing support platform 22 supports one end portion of a latch spring 68 described later.

As shown in FIG. 3, the pin bases 30 are revolvably supported on the outer peripheral part of the rotary table 20 at positions separated at predetermined intervals, such as intervals of 60°, in the annular direction. The number of pin bases 30 and their arrangement positions are determined in consideration of the size of a substrate to be gripped, the rotational speed of the rotary table 20, and its speed change, although it is preferable to provide at least three pin bases 30 on the outer peripheral part of the rotary table 20 equidistantly in the annular direction.

The pin bases 30 are supported by the rotary table 20 at positions separated from the rotational axis C1 such that each of them is revolvable about a rotational axis C2 that is set in parallel with the rotational axis C1. As shown in FIG. 2, each pin base 30 has a cylindrical shape that contains the lower end portion of the pin fixing member 40 described later. The pin base 30 includes a head portion 31 on the upper side to support the pin fixing member 40. The pin base 30 has a through hole 32 formed in its lateral side, through which a pin lever (arm portion) 62 described later is protruded from inside. The lower end portion of the pin base 30 is protruded to the lower surface of the rotary table 20.

The pin fixing member 40 is revolvably supported by the head portion 31. The pin fixing member 40 is revolvable about a rotational axis C3 that is arranged at a position eccentric from the rotational axis C2 and is set in parallel with the rotational axis C2.

The pin lever 62 described later is protruded from the lower end portion of the pin fixing member 40 and is extended through the through hole 32 toward the radial direction inner side of the rotary table 20.

A first chuck pin 41 and a second chuck pin 42 are provided on the upper surface of the pin fixing member 40. The first chuck pin 41 and the second chuck pin 42 are set in parallel with the rotational axis C3 and are arranged at positions symmetric each other with respect to a plane that includes the rotational axis C3 along with an axis extended in the protruded direction of the pin lever 62 (the positions are symmetric each other with respect to the symmetric axis of a recessed portion 63 formed at the distal end of the pin lever 62, wherein the symmetric axis passes through the rotational axis C3). As shown in FIG. 3, when viewed from above the substrate gripping device 1, the first chuck pin 41 is a chuck pin present on the clockwise direction side. Further, when viewed from above the substrate gripping device 1, the second chuck pin 42 is a chuck pin present on the counter-clockwise direction side.

As shown in FIGS. 3 and 4, the gripping force generation mechanism 50 includes a parent gear 52 having an almost circular disk shape and held by the power transmission body 7 and child gears 51 each having a sectorial shape and respectively fitted to the lower ends of the pin bases 30.

The parent gear 52 is rotatably supported by the power transmission body 7 via a bearing 53. The parent gear 52 includes toothed portions 52a formed on its outer peripheral side at intervals of 60° in the annular direction to mesh with the child gears 51. As shown in FIG. 3, the parent gear 52 is biased in a predetermined rotational direction, such as the counter-clockwise direction, by a spring member 54 provided on the lower surface of the rotary table 20.

Each of the child gears 51 includes a toothed portion 51a formed on its outer peripheral side to mesh with the parent gear 52.

In the gripping force generation mechanism 50, since the parent gear 52 is biased counter-clockwise by the spring member 54, the child gears 51 are revolved in the clockwise direction. Each of the pin bases 30 is operated in conjunction with this revolving such that the pin fixing member 40, the first chuck pin 41, and the second chuck pin 42 are rotated about the rotational axis C2 to come into a gripping state of gripping the substrate W. This gripping state is any one of the first state, the second state, and the third state described later.

In order to cancel the gripping state of the substrate W, only the rotary table 20 is revolved by 5° to 15° in a state where the rotation of the parent gear 52 is prevented by the canceling mechanism 9 provided on the cup body 2. By doing so, the pin bases 30 are rotated in the counter-clockwise direction, and the state of chucking the substrate W made by the first chuck pins 41 and the second chuck pins 42 is thereby canceled.

The chuck pin switching mechanism 60 includes cam members 61 respectively fitted to the lower end portions of the pin fixing members 40, and the annular inertia member 64 provided above the upper surface of the rotary table 20 and configured to be rotated about the rotational axis C1.

Figure 11:
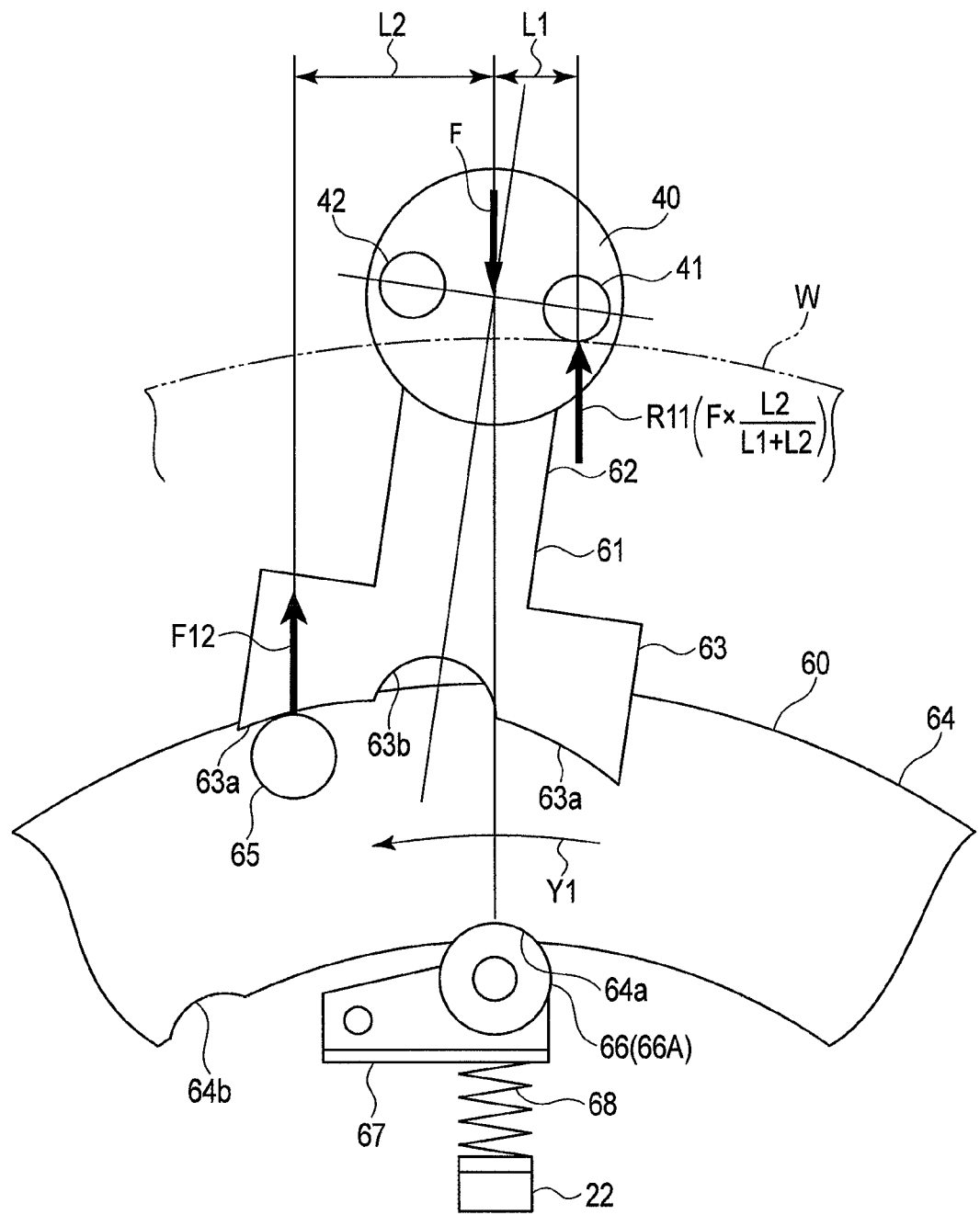
FIG. 11 is an explanatory view showing a force and a moment generated in the main part of the chuck pin switching mechanism when the chuck pin switching mechanism is in the first state.

As shown in FIGS. 2 and 4, each of the cam members 61 includes the pin lever 62 protruded from the lower end of the pin fixing member 40 toward the radial direction inner side of the rotary table 20, and the recessed portion 63 formed at the distal end of the pin lever 62. As shown in FIGS. 11 to 13, the inner wall of the recessed portion 63 has a symmetric shape with respect to a symmetric axis in the extended direction of the pin lever 62. In the example shown by the drawings, this inner wall includes a semicircular part 63b present at the symmetric axis position (i.e., at the center) along with arc parts 63a respectively formed on both sides of the semicircular part 63b. A protruded member 65 described later is positioned on the inner side of the recessed portion 63.

As shown in FIG. 1, the lower surface side of the inertia member 64 is supported by the support bearings 21 provided on the rotary table 20. Further, as shown in FIG. 4, the inner peripheral side of the inertia member 64 is supported by the rotary table 20 via bearings 66 (66A, 66B, 66C, 66D, 66E, and 66F) to be rotatable about the rotational axis C1.

The inertia member 64 includes latch grooves 64a and 64b on its inner peripheral side, with which the bearing 66A is to engage.

Further, the inertia member 60 is equipped with protruded members 65 erected on its upper surface at positions separated at intervals of, e.g., 60°, which correspond to the pin bases 30 provided on the outer peripheral part of the rotary table 20. More specifically, the protruded members 65 are arranged to respectively correspond to the recessed portions 63 of the pin levers 62 that are respectively provided at the pin bases 30.

As shown in FIG. 4, a revolving support arm 67 is supported by the rotary table 20 such that it is revolvable about its one end portion. The bearing 66A is supported on the other end portion of the revolving support arm 67. The revolving support arm 67 is biased outward in the radial direction of the rotary table 20 by the latch spring 68 provided on the fixing support platform 22. The bearing 66A is pushed onto the inner peripheral side of the inertia member 64 by this bias. The bearing 66A engages with the latch grooves 64a and 64b respectively in the first state and the third state described later.

The inertia member 64 is further equipped with a pair of stoppers (restriction members) 69A and 69B protruded on its inner peripheral side at positions near the bearing 66B and configured to engage with the bearing 66B. The bearing 66B is positioned between the stopper 69A and the stopper 69B. The stoppers 69A and 69B define the revolving angle range of the inertia member 64 relative to the rotary table 20 to be 20°, for example. The stoppers 69A and 69B serve to prevent the protruded members 65 from coming off respectively from the recessed portions 63 even if the bearing 66A is moved beyond the latch grooves 64a and 64b. Accordingly, the angle between the stoppers 69A and 69B is not limited to 20° but can be any angle that prevents the protruded members 65 from coming off respectively from the recessed portions 63.

The holding cylinder 70 is arranged to be extended through the power transmission body 7. The lower nozzle head 71 is attached to the upper end of the holding cylinder 70. The lower nozzle head 71 is configured to spout a process liquid onto the substrate W. The upper nozzle head 72 is disposed above the rotary table 20 and configured to spout a process liquid onto the top surface of the substrate W. A substrate processing apparatus of this kind is used for performing a film formation process or cleaning process on a substrate.

Further, as shown in FIG. 1, the substrate gripping device 1 includes a control unit D. The control unit D is configured to control the drive of a control motor M, the process liquid delivery from the upper nozzle head 72, the process liquid delivery from the lower nozzle head 71, and the drive of the canceling mechanism 9.

The substrate gripping device 1 constituted as described above performs the switching between the first state, the second state, and the third state described later by use of the angular acceleration of the rotary table 20 generated by the control motor M and the inertia moment of the inertia member 64 about the rotational axis C1, while keeping the state of gripping the substrate W.

Figure 5:
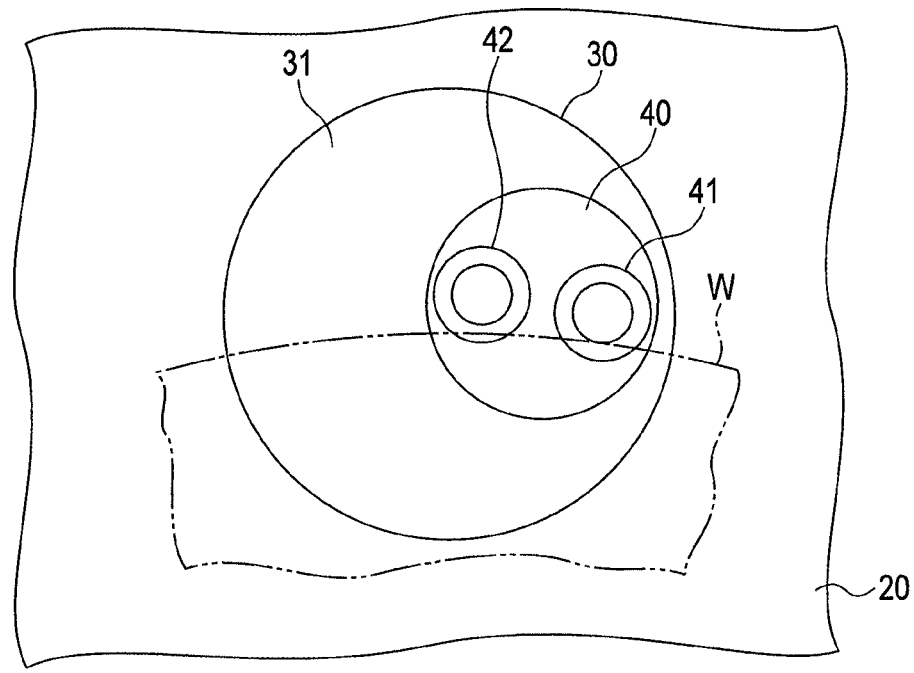
FIG. 5 is a plan view showing a substrate gripping state of a main part of the chuck pin switching mechanism in a first state.
Figure 6:
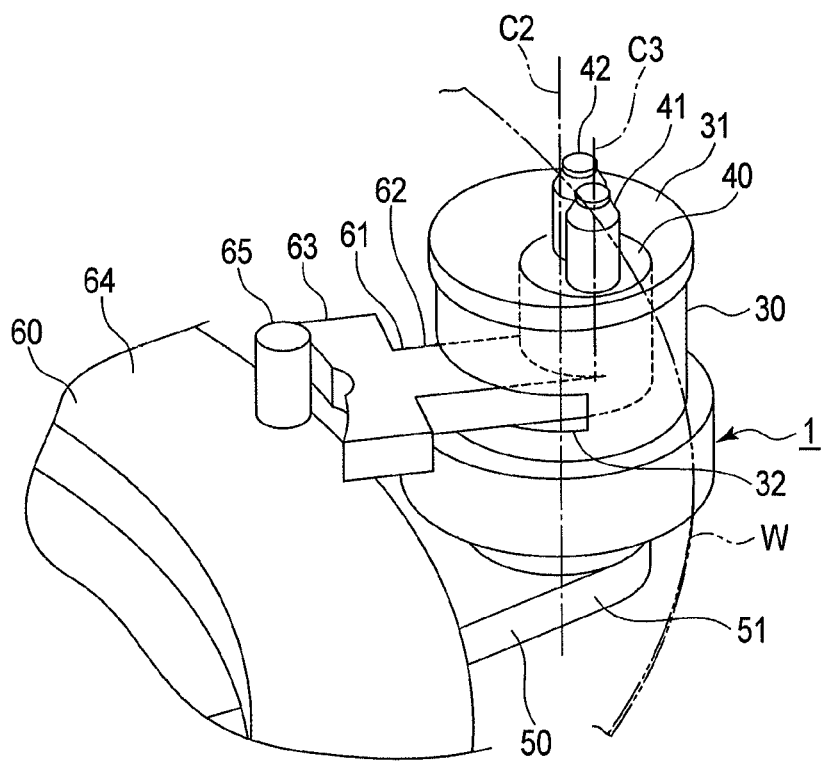
FIG. 6 is a perspective view showing this substrate gripping state of the main part of the chuck pin switching mechanism.
Figure 7:
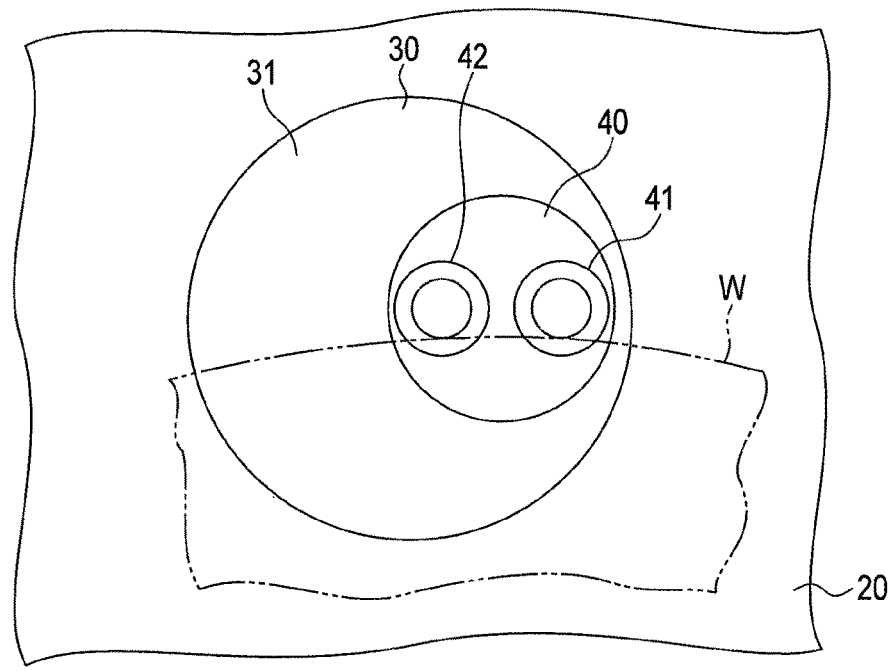
FIG. 7 is a plan view showing a substrate gripping state of the main part of the chuck pin switching mechanism in a second state.
Figure 8:
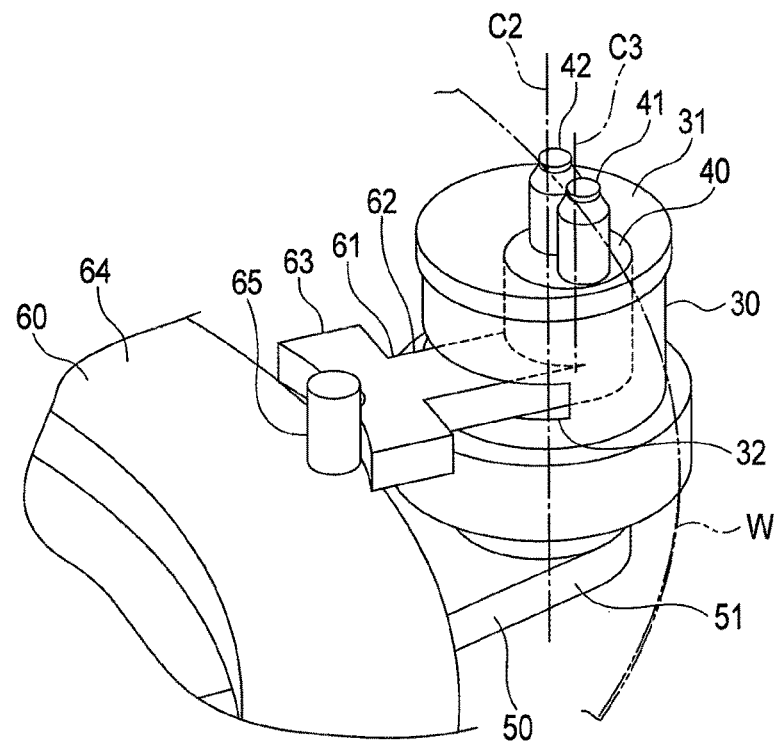
FIG. 8 is a perspective view showing this substrate gripping state of the main part of the chuck pin switching mechanism.
Figure 9:
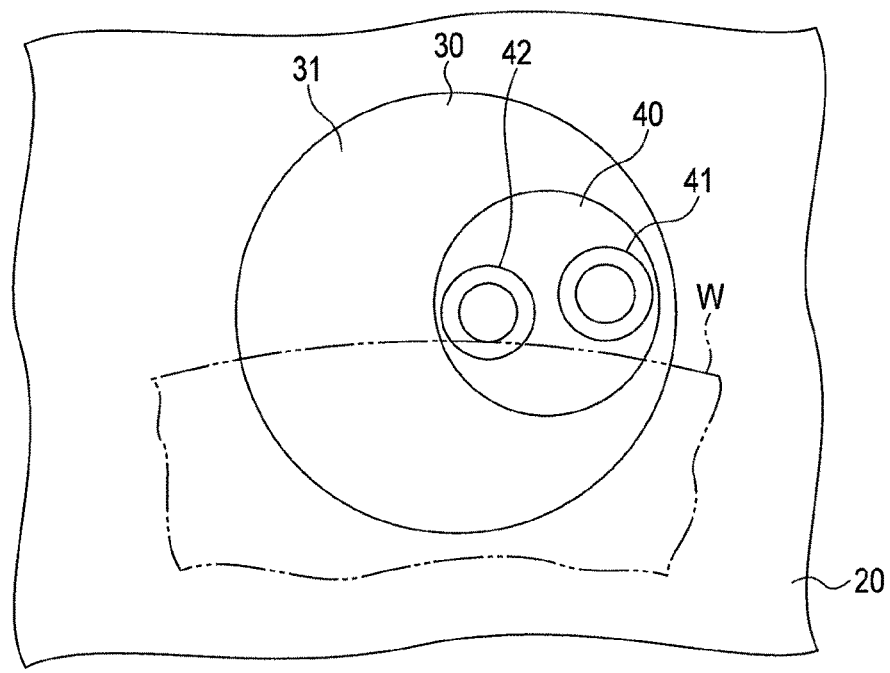
FIG. 9 is a plan view showing a substrate gripping state of the main part of the chuck pin switching mechanism in a third state.
Figure 10:
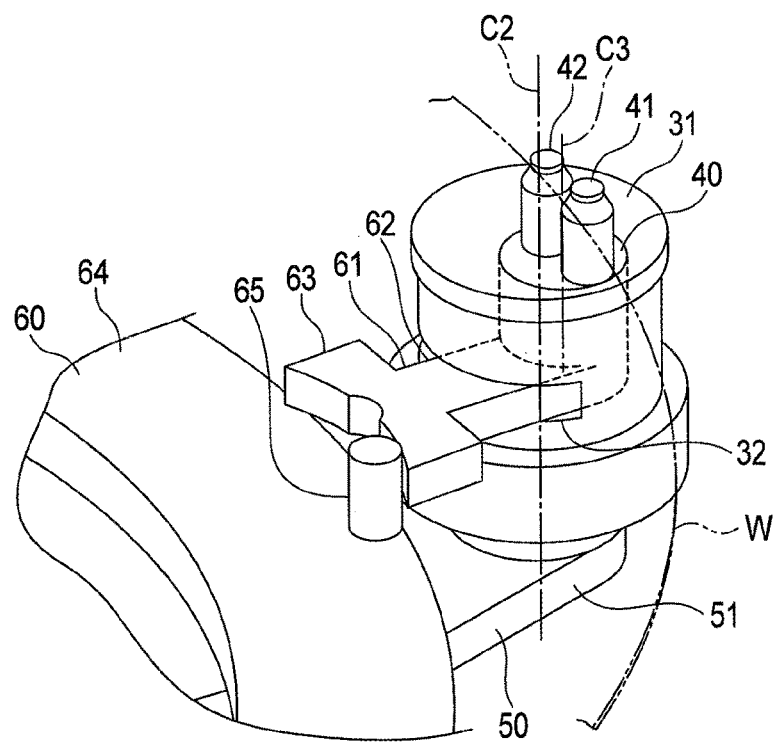
FIG. 10 is a perspective view showing this substrate gripping state of the main part of the chuck pin switching mechanism.

FIG. 5 is a plan view showing the first state of a main part of the chuck pin switching mechanism 60. FIG. 6 is a perspective view showing the first state of the main part of the chuck pin switching mechanism 60. FIG. 7 is a plan view showing the second state of the main part of the chuck pin switching mechanism 60. FIG. 8 is a perspective view showing the second state of the main part of the chuck pin switching mechanism 60. FIG. 9 is a plan view showing the third state of the main part of the chuck pin switching mechanism 60. FIG. 10 is a perspective view showing the third state of the main part of the chuck pin switching mechanism 60. FIG. 11 is an explanatory view showing a force and a moment generated in the main part of the chuck pin switching mechanism 60 in the first state. FIG. 12 is an explanatory view showing a gripping force generated in the main part of the chuck pin switching mechanism 60 in the second state. FIG. 13 is an explanatory view showing a force and a moment generated in the main part of the chuck pin switching mechanism 60 in the third state.

Although the details will be described later, the first state is a state where the bearing 66A engages with the latch groove 64a of the inertia member 64, and the third state is a state where the bearing 66A engages with the latch groove 64b of the inertia member 64. The second state is a state in between switching from the first state to the third state, a state in between switching from the third state to the first state, or a state where the rotation of the rotary table 20 is stopped.

The switching between the first state, the second state, and the third state is performed by utilizing an inertia force generated on the inertia member 64 by the angular acceleration of the rotary table 20. This inertia force can be obtained by multiplying the inertia moment of the inertia member 64 by the angular acceleration of the rotary table 20.

Accordingly, the angular acceleration (switching angular acceleration) necessary for the switching between the first state, the second state, and the third state depends on the inertia moment of the inertia member 64. By controlling the time period of applying the switching angular acceleration to the inertia member 64, it is also possible not to perform the complete switching from the first state to the third state or from the third state to the first state but to keep the second state even when the rotary table 20 is being rotated.

Next, an explanation will be given of a stoppage state where the rotary table 20 is stopped, and manners of switching to the first state, the second state, and the third state. In the following explanation, the rotary table 20 is rotated counter-clockwise in the first state, the second state, and the third state, when viewed from above.

In the stoppage state where the rotary table 20 is not rotated, the substrate W is gripped by both of the first chuck pins 41 and the second chuck pins 42. At this time, each of the protruded members 65 is positioned inside the semicircular part 63b of the recessed portion 63 such that it is out of contact with the recessed portion 63. Specifically, this is the same state as the second state shown in FIGS. 7 and 8. At this time, the gripping force, with which the substrate W is gripped by the first chuck pins 41 and the second chuck pins 42, is generated by the spring member 54. Specifically, the parent gear 52 is biased by the spring member 54, and a moment about the rotational axis C2 is thereby generated on each of the pin bases 30 via the child gears 51. With this moment, a force F is generated on each of the pin fixing members 40 toward the radial direction inner side of the rotary table 20. Thus, a gripping force F/2 is generated on each of the first chuck pin 41 and the second chuck pin 42 (see FIG. 12).

From the stoppage state of the rotary table 20, it is also possible to set the first state by causing the bearing 66A to engage with the notch groove 64a, and to set the third state by causing the bearing 66A to engage with the notch groove 64b.

As shown in FIGS. 5, 6, and 11, the first state is a state where the substrate W is gripped only by the first chuck pins 41. This is a state where the rotary table 20 is deceleratively rotated. Specifically, in the first state, when the rotary table 20 is rotated with an angular acceleration lower than a first angular acceleration (primary angular acceleration) α1, the first chuck pins 41 grip the substrate W and the second chuck pins 42 separate from the substrate W. In the first state, since the rotary table 20 is deceleratively rotated, the first angular acceleration α1 takes a negative value. Accordingly, an angular acceleration lower than α1 means a negative value with its absolute value larger than the absolute value of α1.

In the first state, the angular acceleration of the rotary table 20 being rotated is generated in the speed reduction direction. Accordingly, an inertia force is generated on the inertia member 64, by the angular acceleration of the rotary table 20 and the inertia moment of the inertia member 64, in the rotational direction of the rotary table 20, i.e., a direction indicated by an arrow Y1 in FIG. 11. Due to this inertia force acting on the inertia member 64, the inertia member 64 is rotated in the arrow Y1 direction relative to the rotary table 20, and so the latch groove 64a engages with the bearing 66A. In other words, an angular acceleration lower than the primary angular acceleration is a negative angular acceleration not smaller than that for causing the inertia member 64 and the rotary table 20 to rotate relative to each other. The time period of applying this angular acceleration needs to include a time period of obtaining the first state, by the latch groove 64a coming to engage with the bearing 66A, from the second state described above. Once the latch groove 64a engages with the bearing 66A, the first state can be kept even if the acceleration is decreased from this state.

When the inertia member 64 is rotated in the arrow Y1 direction relative to the rotary table 20, each of the protruded members 65 pushes that part of the inner wall of the recessed portion 63, which is on the forward side in the rotational direction of the rotary table 20. Consequently, a moment about the axis C3 is generated on the pin fixing member 40. Due to this moment, the second chuck pin 42 is moved in a direction to be separated from the substrate W, and so the first chuck pin 41 presses the substrate W only by itself. In FIG. 11, R11 denotes a reaction force generated at this time.

In the first state, as shown in FIG. 11, the moments having the contact point between the protruded member 65 and the recessed portion 63 as a fulcrum are balanced. Specifically, the reaction force R11 due to the pressing by the first chuck pin 41 and the force F establish a relationship of $F \times L2 = R11 \times (L1+L2)$ therebetween. In FIG. 11, L1 denotes the distance between the first chuck pin 41 and the center of the pin fixing member 40 in a direction perpendicular to the radial direction of the rotary table 20 in the first state. Further, L2 denotes the distance between the center of the pin fixing member 40 and the contact point between the protruded member 65 and the recessed portion 63 in a direction perpendicular to the radial direction of the rotary table 20 in the first state.

The second state is a state obtained from the first state described above, such that the rotary table 20 is acceleratively rotated with an angular acceleration higher than a second angular acceleration (secondary angular acceleration) $\alpha 2$, and then the angular acceleration is set to be not higher than $\alpha 2$ (including constant speed rotation) in a short time. In this case, $\alpha 2$ is a positive value. When the rotary table 20 is acceleratively rotated with an angular acceleration higher than $\alpha 2$, an inertia force acts on the inertia member 64. Due to this inertia force, the inertia member 64 is rotated in the clockwise direction relative to the rotary table 20, and so the engagement of the latch groove 64a with the bearing 66A is canceled. In other words, an angular acceleration higher than $\alpha 2$ is a positive angular acceleration not smaller than that for canceling the engagement of the latch groove 64a with the bearing 66A and causing the inertia member 64 to rotate clockwise direction relative to the rotary table 20. Further, the short time mentioned above is a time period within a range with which the bearing 66A released from the latch groove 64a does not come to engage with the latch groove 64b by additional relative rotation between the inertia member 64 and the rotary table 20. Consequently, as shown in FIGS. 7 and 8, the substrate W is gripped by both of the first chuck pins 41 and the second chuck pins 42 in the second state.

This second state is kept when the rotary table 20 is being rotated at a constant angular speed, for example. In this state, as shown in FIG. 12, a gripping force F is generated on each of the pin fixing members 40. Specifically, as shown in FIG. 12, forces R1 and R2 in a direction pushing back from the substrate W are respectively generated on the first chuck pin 41 and the second chuck pin 42. The substrate W is clamped by these forces R1 and R2, wherein each of R1 and R2 is expressed by F/2. Further, when the rotary table 20 is being rotated at a constant angular speed, it involves no angular acceleration generated thereon, and so no inertia force is generated on the inertia member 64. Thus, this is a state where each of the first chuck pin 41 and the second chuck pin 42 receives no force generated thereon in a direction to separate it from the substrate W.

In the example described above, the rotary table 20 is rotated at a constant angular speed in the second state. However, even when an angular acceleration is generated thereon, the same state can be kept if the value of this angular acceleration is higher than $\alpha 1$ and lower than $\alpha 2$.

As shown in FIGS. 9, 10, and 13, the third state is a state where the substrate W is gripped only by the second chuck pins 42. This is a state where the rotary table 20 is acceleratively rotated. Specifically, in the third state, when the rotary table 20 is acceleratively rotated with an angular acceleration higher than the second angular acceleration (secondary angular acceleration) $\alpha 2$, the second chuck pins 42 grip the substrate W and the first chuck pins 41 separate from the substrate W.

In the third state, the angular acceleration of the rotary table 20 is generated in the speed increase direction. Accordingly, an inertia force is generated on the inertia member 64, by the angular acceleration of the rotary table 20 and the inertia moment of the inertia member 64, in the direction opposite to the rotational direction of the rotary table 20, i.e., a direction indicated by an arrow Y2 in FIG. 13. Due to this inertia force acting on the inertia member 64 in the Y2 direction, the inertia member 64 is rotated relative to the rotary table 20, and so the latch groove 64b engages with the bearing 66A. The time period of applying this secondary angular acceleration needs to include a time period of obtaining the third state, by the latch groove 64b coming to engage with the bearing 66A, from the second state described above. Once the latch groove 64b engages with the bearing 66A, the third state can be kept even if the acceleration is decreased from this state.

When the inertia member 64 is rotated in the arrow Y2 direction relative to the rotary table 20, each of the protruded members 65 pushes that part of the inner wall of the recessed portion 63, which is on the backward side in the rotational direction of the rotary table 20. Consequently, a moment about the axis C3 is generated on the pin fixing member 40. Due to this moment, the first chuck pin 41 is moved in a direction to be separated from the substrate W, and so the second chuck pin 42 presses the substrate W only by itself. In FIG. 13, R22 denotes a reaction force generated at this time.

In the third state, as shown in FIG. 13, the rotational moments having the contact point between the protruded member 65 and the recessed portion 63 as a fulcrum are balanced. Specifically, the reaction force R22 due to the pressing by the second chuck pin 42 and the force F establish a relationship of $F \times L4 = R22 \times (L3+L4)$ therebetween. In FIG. 13, L3 denotes the distance between the second chuck pin 42 and the center of the pin fixing member 40 in a direction perpendicular to the radial direction of the rotary table 20 in the third state. Further, L4 denotes the distance between the center of the pin fixing member 40 and the contact point between the protruded member 65 and the recessed portion 63 in a direction perpendicular to the radial direction of the rotary table 20 in the third state.

The angular acceleration of the rotary table 20 described above is controlled by the control motor M. Thus, by controlling the control motor M, the switching between the first state and the second state and the switching between the second state and the third state can be flexibly performed.

Further, the first and second chuck pins 41 and 42 are biased by the gripping force generation mechanism 50 in a direction to grip the substrate W (gripping direction). Accordingly, at least one of the chuck pins is set in contact with the outer edge of the substrate W, not only in the first state, the second state, and the third state, but also in between the switching to the respective states.

Figure 14:
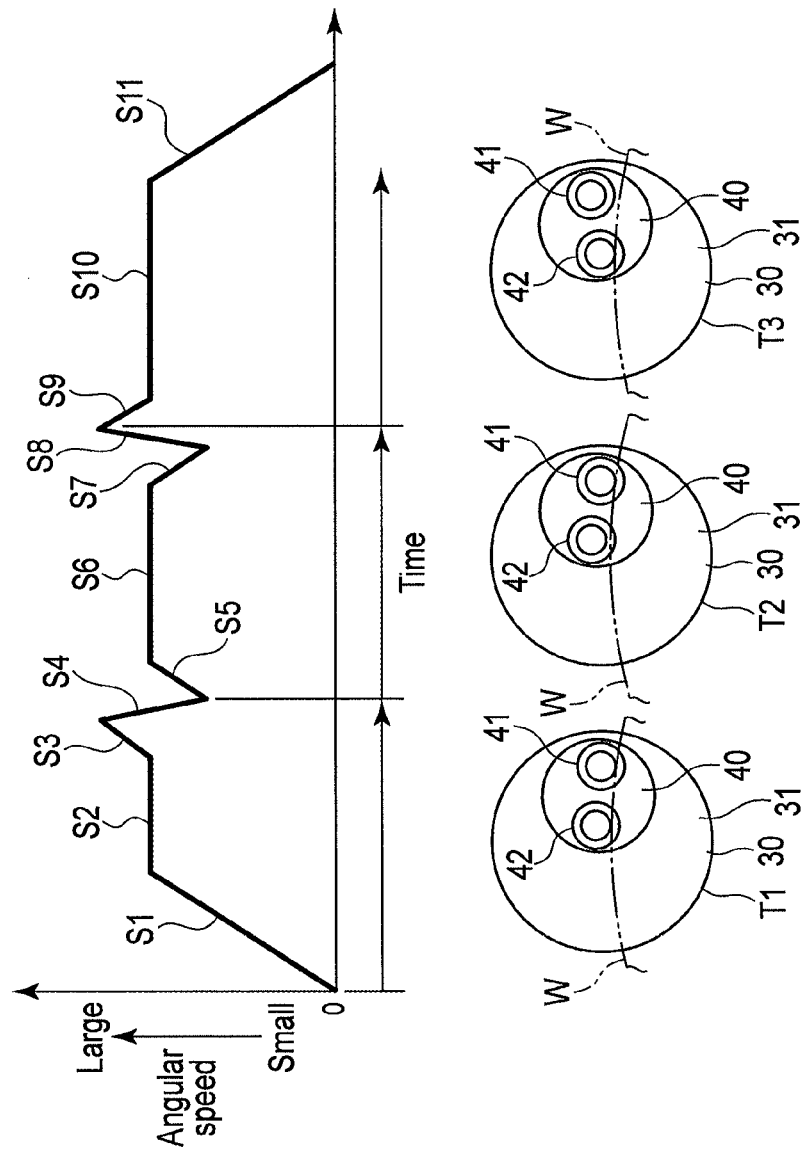
FIG. 14 is an explanatory view showing the relationships of the rotational speed of the rotary table with the first state, the second state, and the third state of the chuck pin switching mechanism.

For example, a process using the substrate gripping device 1 constituted as described above is performed on the substrate W by the procedures shown in FIG. 14. FIG. 14 is an explanatory view showing the relationships of the angular speed of the rotary table 20 with the first state, the second state, and the third state of the chuck pin switching mechanism 60.

In the procedures shown in FIG. 14, the initial state is a state where the substrate W is held by the first chuck pins 41 and the second chuck pins 42 (the second state).

Once the rotary table 20 starts being rotated, the substrate gripping device 1 performs the switching between the substrate gripping states from the second state to the first state and the third state in this order.

Specifically, as shown with 51 in FIG. 14, the rotary table 20 with the substrate W gripped thereon is acceleratively rotated with an angular acceleration not higher than the angular acceleration α2. When the angular speed of the rotary table 20 reaches a predetermined angular speed, it shifts to angular speed constant rotation shown with S2 in FIG. 14. Thereafter, a process liquid is spouted from the upper nozzle head 72 and the lower nozzle head 71 to start processing of the substrate W.

Since the substrate W is rotated by the rotary table 20, the process liquid flows on the surface of the substrate W outward in the radial direction of the substrate W. After the process liquid flows to the outer edge of the substrate W, it is thrown off toward the inner peripheral side of the movable liquid receiver 5B. The process liquid thus received by the movable liquid receiver 5B is guided through the liquid receiver 5A into the discharge pipe 6 and is then collected.

When the rotary table 20 is in an acceleration state with an angular acceleration not higher than α2 or in an angular speed constant state, the chuck pin switching mechanism 60 is kept in the second state, as shown with T1 in FIG. 14. In this state, the substrate W is gripped by both of the first chuck pins 41 and the second chuck pins 42. Thus, the process liquid does not flow to the portions of the substrate W gripped by the first chuck pins 41 and the second chuck pins 42, and so these portions are not processed.

This state is shifted to the first state described above, by controlling the control motor M. As shown with S3 in FIG. 14, the rotary table 20 is acceleratively rotated again with an angular acceleration not higher than the second angular acceleration α2, and then, as shown with S4 in FIG. 14, the rotary table 20 is deceleratively rotated with an angular acceleration lower than the first angular acceleration α1. Thus, at S4 in FIG. 14, the substrate gripping device 1 comes into the first state, as shown with T2 in FIG. 14.

Since the substrate gripping device 1 is in the first state, the second chuck pins 42 are separate from the substrate W. Thus, the process liquid flows to the portions of the substrate W which were gripped by the second chuck pins 42, and so these portions are processed. The first state is kept by continuing this decelerative rotation until the bearing 66A comes to engage with the latch groove 64a. Further, thereafter, as long as an angular acceleration within a range of not lower than α1 and not higher than α2 is applied, the bearing 66A is kept engaging with the latch groove 64a, and so the first state is kept through S5, S6, and S7 in FIG. 14.

Then, the state is shifted to the third state described above, by controlling the control motor M. As shown with S7 in FIG. 14, the rotary table 20 is deceleratively rotated with an angular acceleration not lower than the first angular acceleration α1, and then, as shown with S8 in FIG. 14, the rotary table 20 is acceleratively rotated with an angular acceleration higher than the second angular acceleration α2. Thus, at S8 in FIG. 14, the substrate gripping device 1 comes into the third state, as shown with T3 in FIG. 14.

Since the substrate gripping device 1 is in the third state, the first chuck pins 41 are separate from the substrate W. Thus, the process liquid flows to the portions of the substrate W which were gripped by the first chuck pins 41, and so these portions are processed. The third state is kept by continuing this accelerative rotation until the bearing 66A comes to engage with the latch groove 64b. Further, thereafter, as long as an angular acceleration within a range of not lower than α1 and not higher than α2 is applied, the bearing 66A is kept engaging with the latch groove 64b, and so the third state is kept through S9, S10, and S11 in FIG. 14

The process liquid has flowed over the entirety of the substrate W by the end of S10 in FIG. 14, so that the process is performed on the entirety of the substrate W. Then, as shown by S11 in FIG. 14, the rotary table 20 is deceleratively rotated with an angular acceleration not lower than the first angular acceleration α1 until it is stopped, and the process is completed.

In the example shown in FIG. 14, the process is performed while the switching is performed from the second state through the first state to the third state. In this respect, the operations may be completed in the second state, which is realized as follows, for example. Specifically, in the middle of S11, which is in the third state, decelerative rotation is performed with an angular acceleration lower than the angular acceleration α1 to release the bearing 66A from the latch groove 64b. Further, this deceleration time is set to be short enough such that the bearing 66A thus released from the latch groove 64b cannot arrive at the latch groove 64a.

As described above, the substrate gripping device 1 according to this embodiment can switch between the first state where the substrate W is gripped only by the first chuck pins 41 and the third state where the substrate is gripped only by the second chuck pins 42. Accordingly, the process liquid can flow to the portions of the substrate W which are used for gripping by the first chuck pins 41, and also flow to the portions of the substrate W which are used for gripping by the second chuck pins 42. Accordingly, the process can be performed on the entirety of the substrate W.

Further, the switching between the first state and the third state is performed always through the second state in which the substrate W is gripped by both of the first chuck pins 41 and the second chuck pins 42 while the rotary table 20 is rotated. Accordingly, even when the rotary table 20 is being rotated, the substrate W is always kept in a state of being gripped. Accordingly, the switching between the first state and the third state can be stably performed without stopping the rotation of the rotary table 20.

Further, the switching between the first state, the second state, and the third state is performed by use of the inertia member 64 and by changing the angular acceleration of the rotary table 20. Thus, the switching between the first state, the second state, and the third state can be performed solely by controlling the control motor M. Accordingly, it is possible to perform the switching between the first state, the second state, and the third state, without necessitating a complicated device for performing the switching.

As described above, according to the present invention, the switching of the chuck pins for gripping the substrate can be stably performed while the substrate is being rotated.

Further, since the chuck pins are different from those configured to slide the substrate W on their receiving surfaces, they can prevent particles from being generated due to such sliding.

The present invention is not limited to the embodiment described above. For example, in the example described above, the process method is explained as being performed while the switching of the substrate gripping device is performed from the second state through the first state to the third state. However, the present invention may be similarly applied to a case where the switching is performed from the second state through the third state to the first state.

Further, the present invention may be applied to a step of rotating a substrate at a high speed to dry the substrate after a process liquid is spouted onto the substrate. Also in this case, it is possible to efficiently dry the portions of the substrate which are used for contact with chuck pins, by suitably performing the switching between the first state, the second state, and the third state.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate gripping device for rotating a substrate while gripping outer edge portions of the substrate, the substrate gripping device comprising:
   a rotary table configured to be rotated;
   a drive portion configured to rotate the rotary table;
   first and second chuck pins provided on the rotary table and configured to be into contact with an outer edge of the substrate;
   a single inertia member disposed coaxially with the rotary table and configured to be rotated relative to the rotary table; and
   a chuck pin switching mechanism configured to switch into any one of a first state where the first chuck pin is in contact with the outer edge of the substrate while the second chuck pin is separate from the outer edge of the substrate, a second state wherein the first and second chuck pins are in contact with the outer edge of the substrate, and a third state where the first chuck pin is separate from the outer edge of the substrate while the second chuck pin is in contact with the outer edge of the substrate, by utilizing a relative rotation between the rotary table and the single inertia member upon a change in rotational speed of the rotary table, wherein a switching between the first state and the third state is performed through the second state.

2. The substrate gripping device according to claim 1, further comprising a gripping force generation mechanism configured to bias the first and second chuck pins in a direction to grip the substrate.

3. The substrate gripping device according to claim 1, further comprising a control unit configured to control the drive portion such that the first and second chuck pins are set in the second state when the rotary table starts being rotated, and then are switched into the first state and the third state in this order, and the first and second chuck pins are set in the second state when the rotary table stops being rotated.

4. The substrate gripping device according to claim 3, wherein the control unit is configured to control the drive portion such that the rotary table is deceleratively rotated when the second state is switched to the first state, and the rotary table is acceleratively rotated when the first state is switched to the third state.

5. The substrate gripping device according to claim 1, wherein the rotary table includes a bearing that supports the inertia member, and
   the inertia member includes an inner peripheral side on which a latch groove is formed to engage with the bearing.

6. A substrate gripping device for rotating a substrate while gripping outer edge portions of the substrate, the substrate gripping device comprising:
   a rotary table configured to be rotated;
   a drive portion configured to rotate the rotary table;
   a pin base supported by the rotary table at a position separated from a rotational axis of the rotary table and configured to be revolved about an axis parallel with the rotational axis of the rotary table;
   a pin fixing member supported by the pin base at a position eccentric from a rotational axis of the pin base and configured to be revolved about an axis parallel with the rotational axis of the pin base, the pin fixing member being configured to move closer to or away from the rotational axis of the rotary table upon the pin base revolving;
   first and second chuck pins provided on the pin fixing member in parallel with a rotational axis direction of the pin fixing member and configured to be into contact with an outer edge of the substrate;
   a substrate gripping force generation mechanism including a spring member configured to move the first and second chuck pins in a gripping direction;
   a chuck pin switching mechanism including a single inertia member disposed coaxially with the rotary table and configured to be rotated relative to the rotary table, and a cam member provided on the pin fixing member, wherein a protruded member is provided on an outer peripheral part of the inertia member, the cam member includes an arm portion provided on the pin fixing member and extended toward a radial direction inner side of the rotary table, and a recessed portion formed at a distal end of the arm portion and configured to engage with the protruded member, and the chuck pin switching mechanism is configured to switch into any one of a first state where the first chuck pin is in contact with the outer edge of the substrate while the second chuck pin is separate from the outer edge of the substrate, a second state wherein the first and second chuck pins are in contact with the outer edge of the substrate, and a third state where the first chuck pin is separate from the outer edge of the substrate while the second chuck pin is in contact with the outer edge of the substrate, by utilizing a relative rotation between the rotary table and the inertia member upon a change in rotational speed of the rotary table, and wherein a switching between the first state and the third state is performed through the second state.

7. A substrate processing apparatus configured to rotate a substrate while gripping the substrate by a substrate gripping device and to supply a process liquid from a nozzle onto the substrate to process the substrate by use of the process liquid, the substrate processing apparatus comprising:
the substrate gripping device is the substrate gripping device according to claim 1.

8. The substrate gripping device according to claim 5, wherein the inner peripheral side of the inertia member includes a restriction member configured to engage with the bearing and define a revolving angle range of the inertia member relative to the rotary table.

* * * * *